United States Patent [19]
Horine

[11] Patent Number: 6,072,699
[45] Date of Patent: Jun. 6, 2000

[54] METHOD AND APPARATUS FOR MATCHING TRACE LENGTHS OF SIGNAL LINES MAKING 90°/180° TURNS

[75] Inventor: Bryce D. Horine, Aloha, Oreg.

[73] Assignee: Intel Corporation, Santa Clara, Calif.

[21] Appl. No.: 09/120,534

[22] Filed: Jul. 21, 1998

[51] Int. Cl.[7] .............................. H05K 7/06; H05K 7/02
[52] U.S. Cl. ..................... 361/777; 361/748; 361/778; 174/261; 174/262; 365/51; 365/63
[58] Field of Search ..................... 361/748, 749, 361/767, 768, 777, 778, 780, 794, 805; 174/261, 262; 257/723, 773, 776, 786; 365/51, 63; 333/246, 247

[56] References Cited

U.S. PATENT DOCUMENTS

| | | |
|---|---|---|
| 3,718,936 | 2/1973 | Rice, Jr. .................................. 174/261 |
| 4,980,860 | 12/1990 | Houston et al. ........................... 365/51 |
| 5,255,156 | 10/1993 | Chang ...................................... 174/261 |
| 5,619,472 | 4/1997 | Okamura ................................... 365/51 |
| 5,737,053 | 4/1998 | Yomogihara et al. ................... 361/749 |
| 5,864,181 | 1/1999 | Keeth ....................................... 257/776 |
| 6,005,265 | 12/1999 | Kuroda .................................... 257/776 |

*Primary Examiner*—Leo P. Picard
*Assistant Examiner*—John B. Vigushin
*Attorney, Agent, or Firm*—Blakely, Sokoloff, Taylor & Zafman LLP

[57] ABSTRACT

A printed circuit board (PCB) includes a first 90° signal line. The first 90° signal line connects a first location on a first layer of the PCB to a second location on a second layer of the PCB. The PCB includes a second 90° signal line. The second 90° signal line is adjacent and equal in length to the first 90° signal line. The second 90° signal line connects a third location on the first layer of the PCB to a fourth location on the second layer of the PCB.

22 Claims, 8 Drawing Sheets

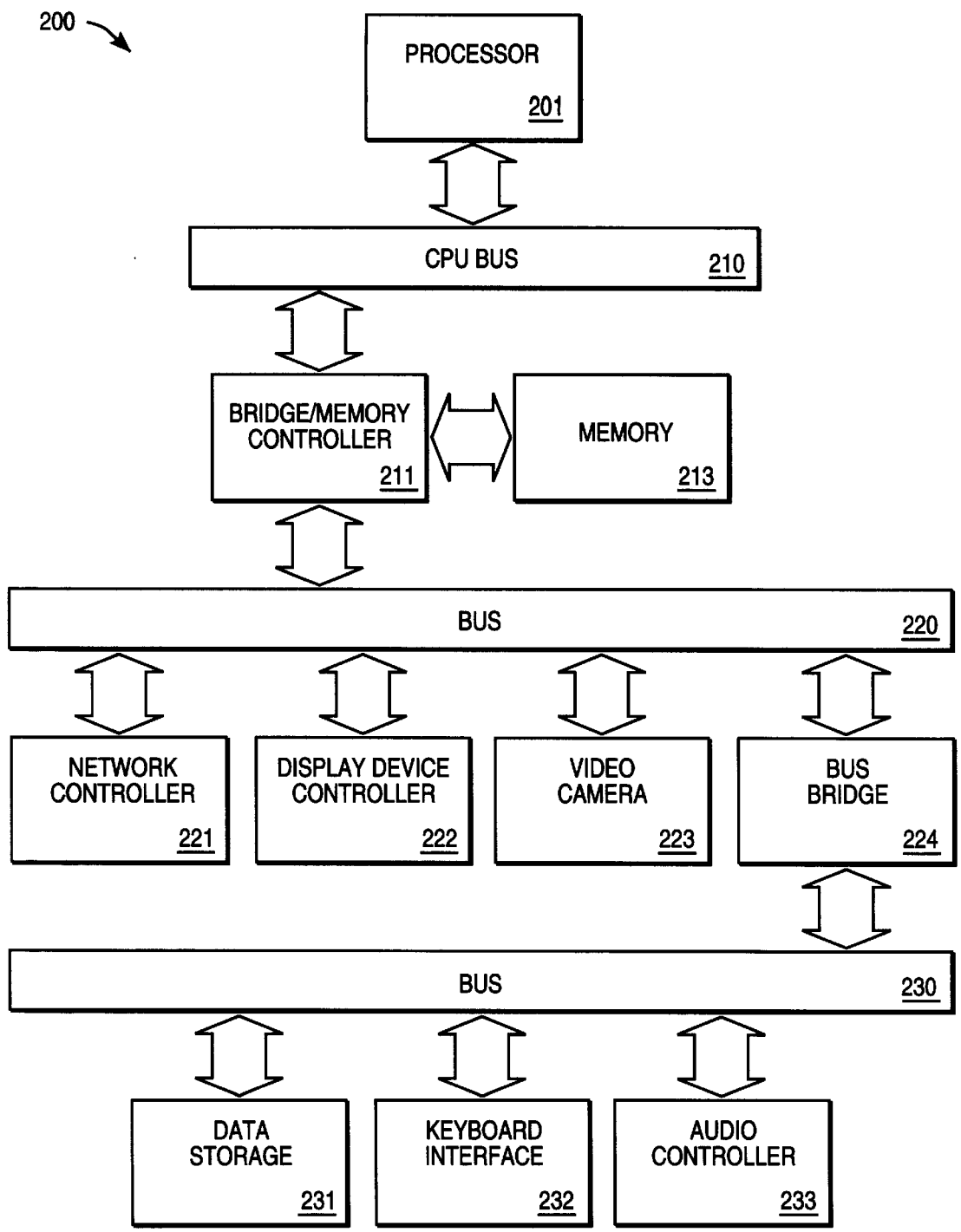
FIG_2

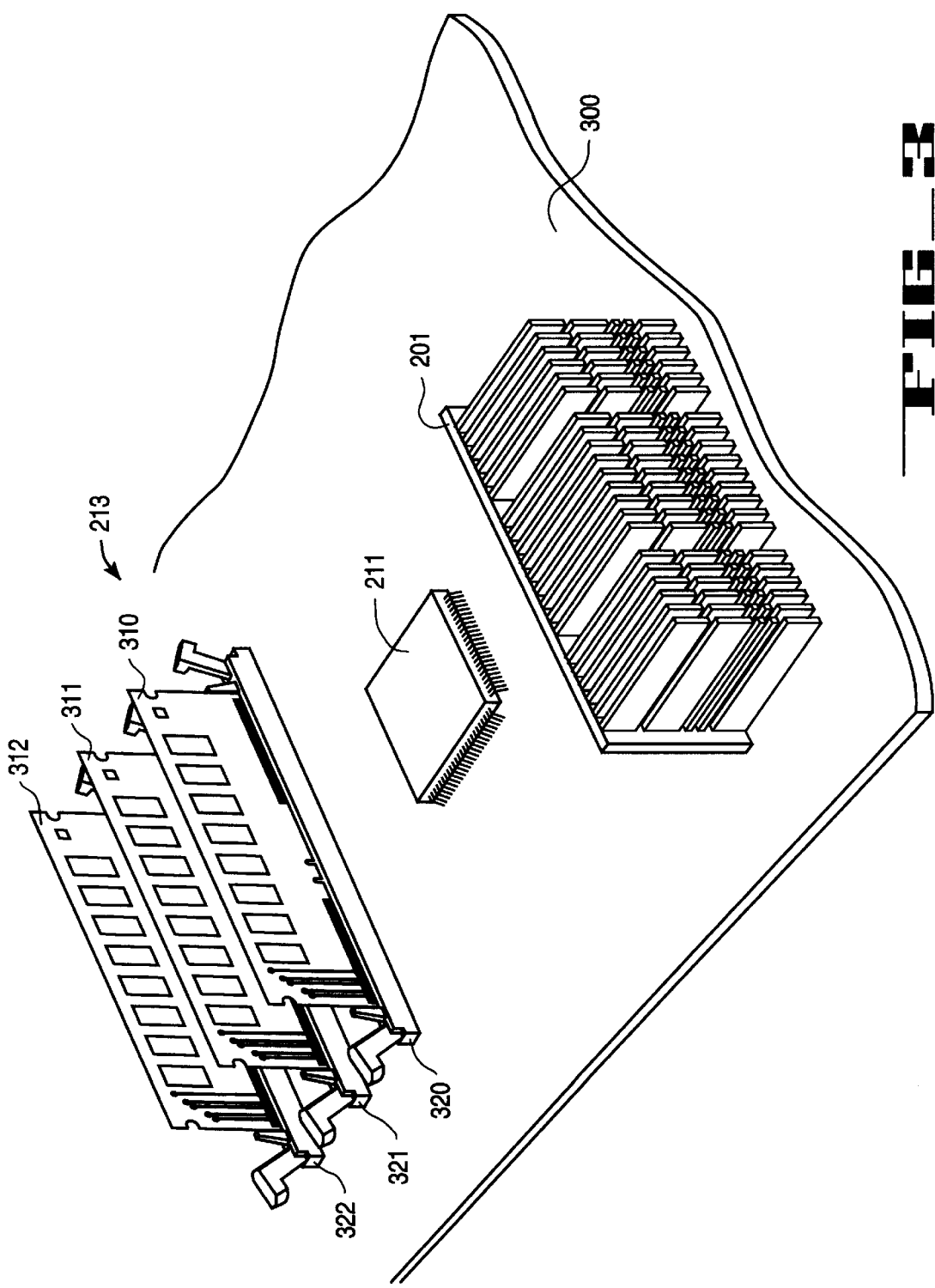

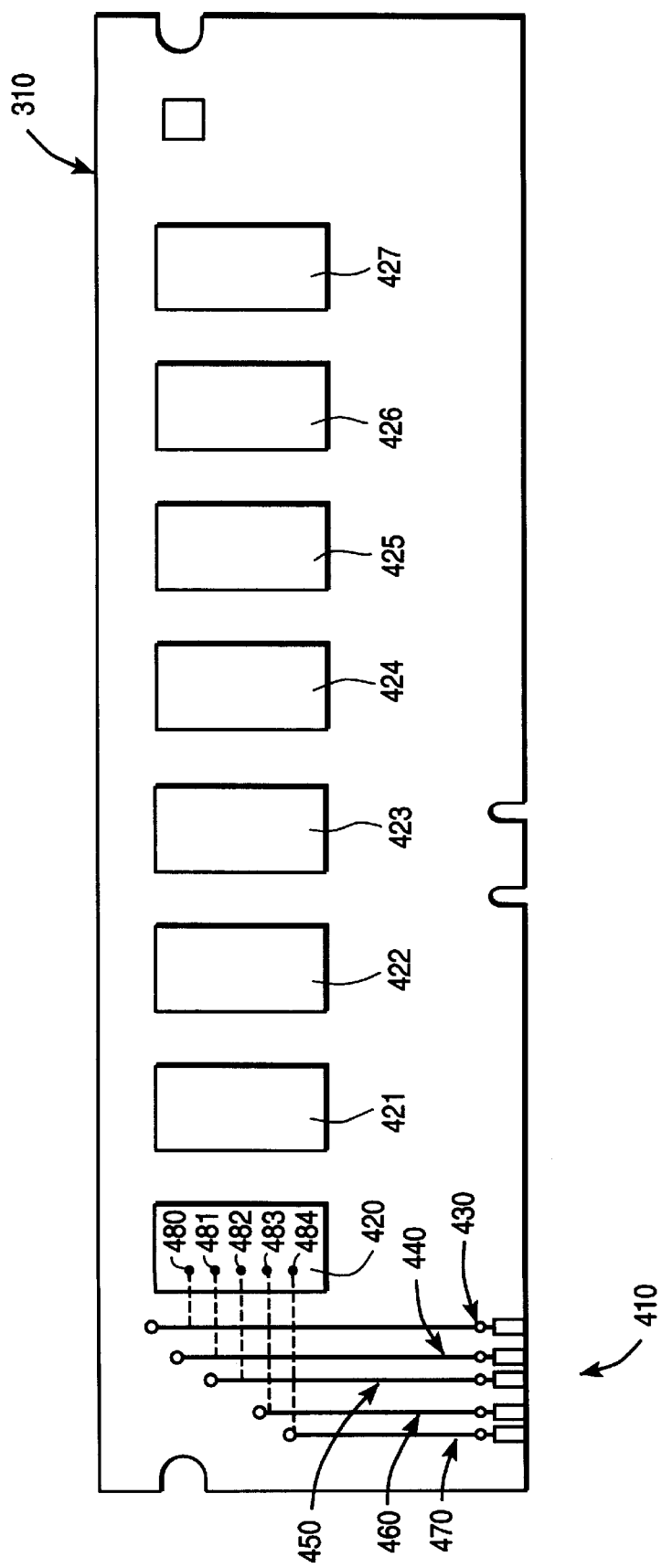
FIG_4

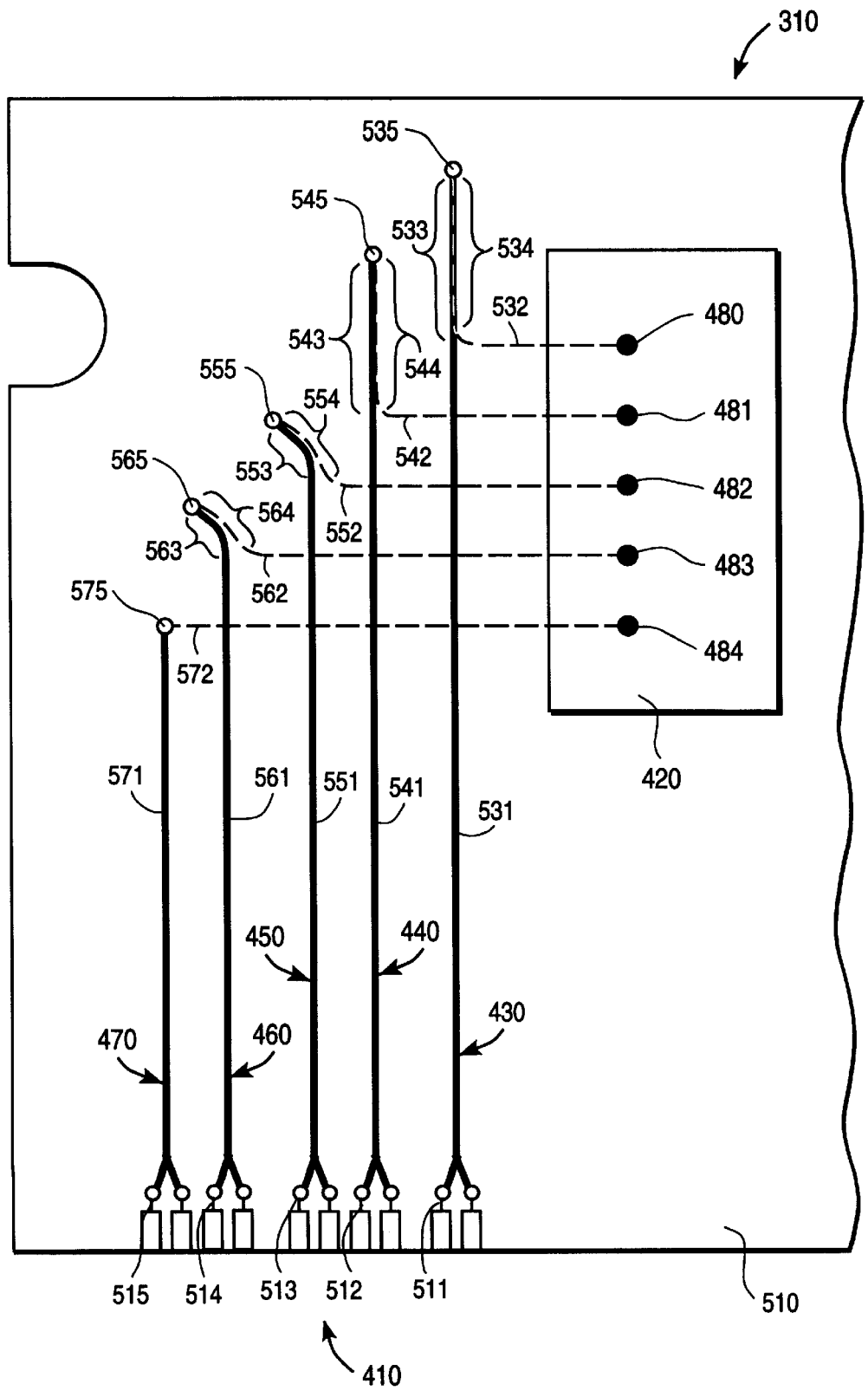
FIG_5

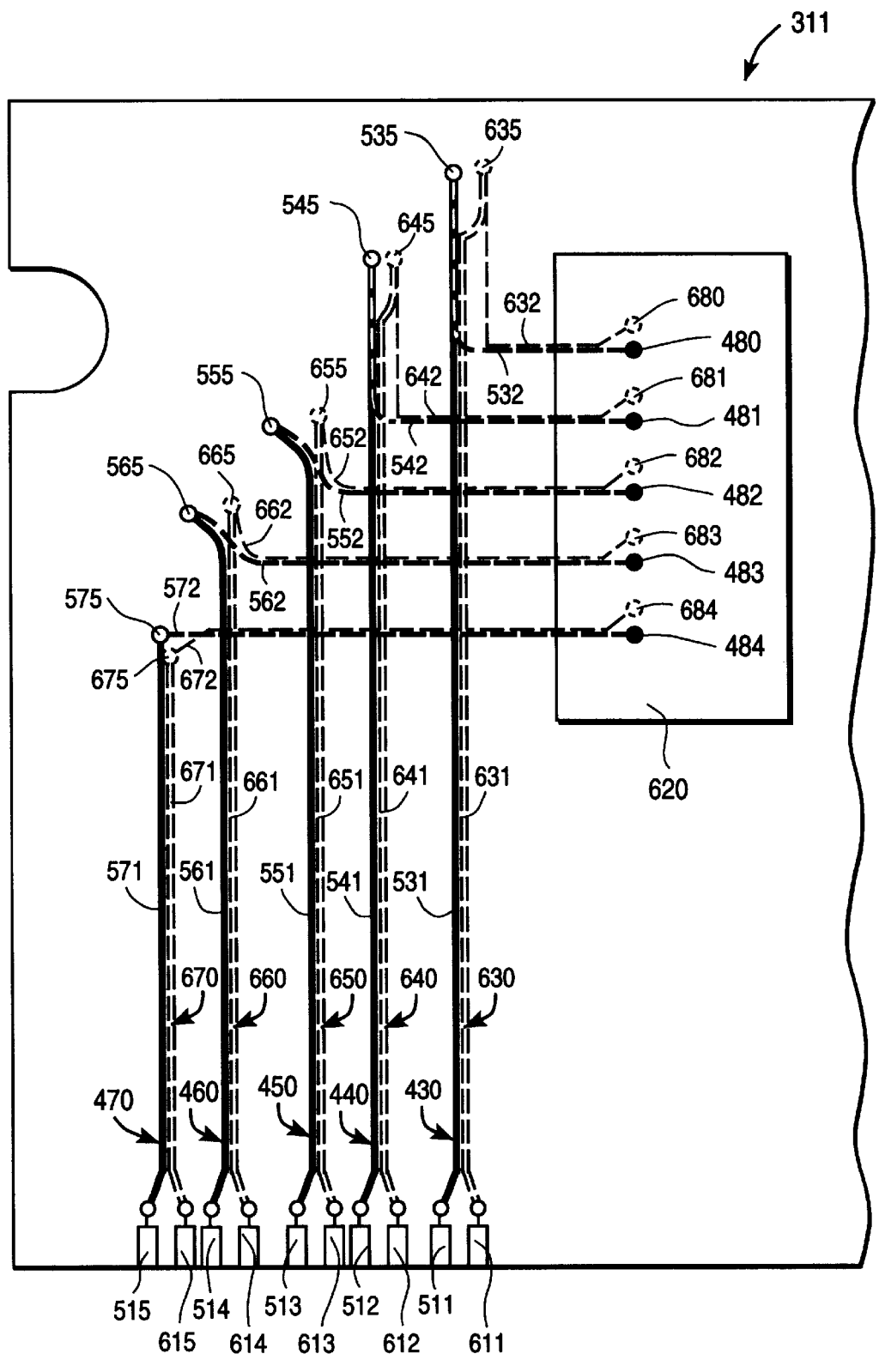
FIG_6

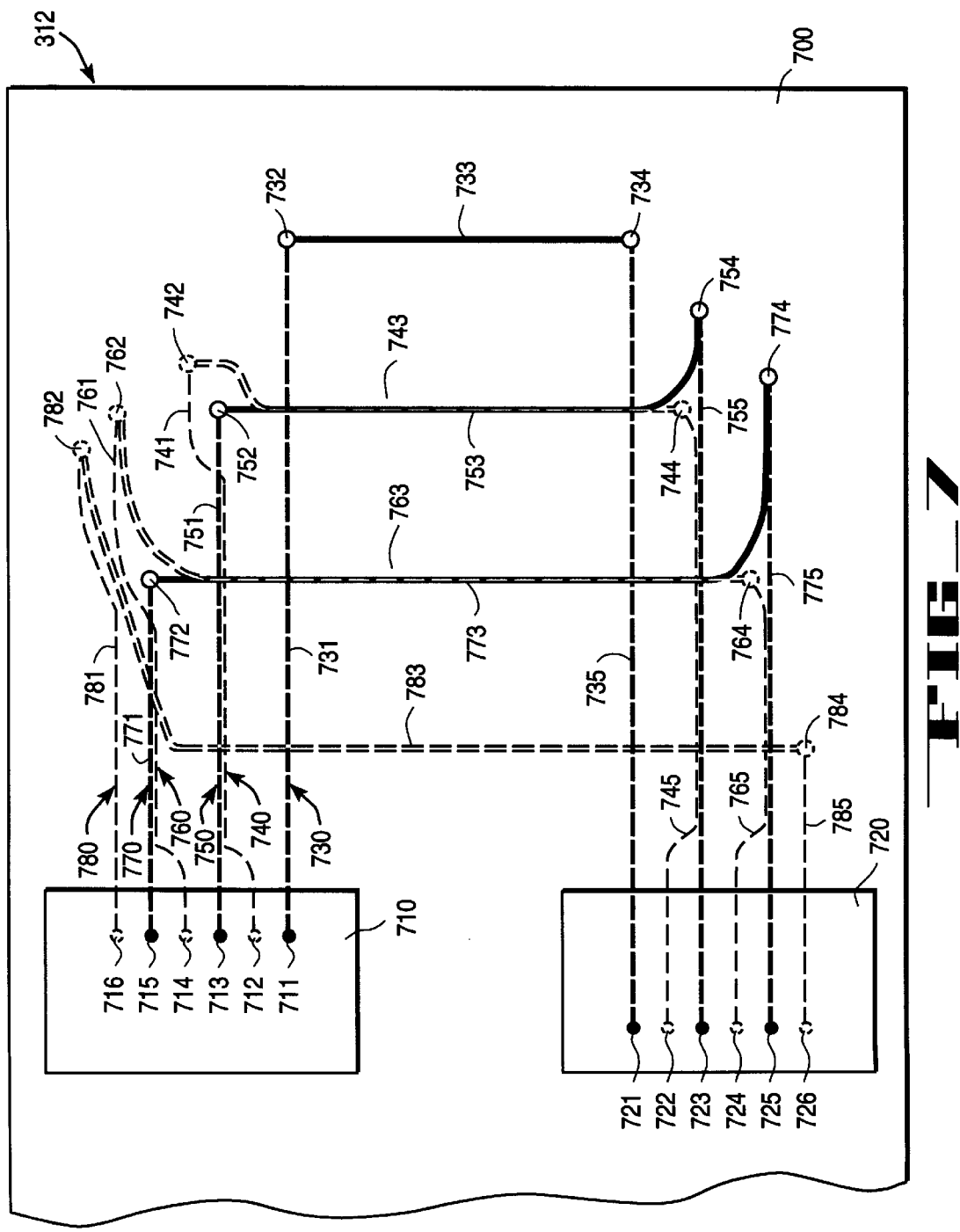

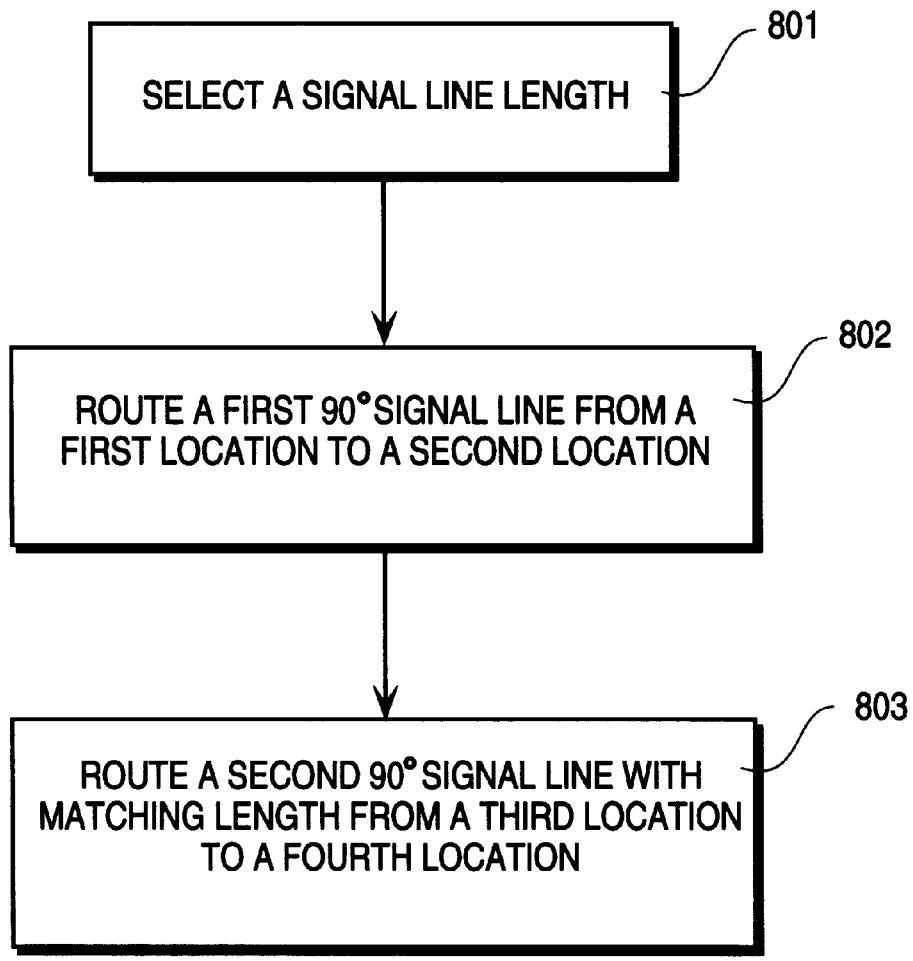
FIG_8

METHOD AND APPARATUS FOR MATCHING TRACE LENGTHS OF SIGNAL LINES MAKING 90°/180° TURNS

FIELD OF THE INVENTION

The present invention relates to signal line routing on a printed circuit board. More specifically, the present invention relates to a method and apparatus for matching trace lengths of signal lines making 90° and 180° turns on a printed circuit board.

BACKGROUND OF THE INVENTION

Computer systems often include devices that are positioned on a printed circuit board such that signal lines interfacing the devices are required to make 90° or 180° turns. FIG. 1 illustrates an example of a prior art technique for routing signal lines making 90° degree turns. FIG. 1 shows a printed circuit board 100 having an electrical connector 110 that interfaces with an off-board component (not shown). Device 120 is mounted on the printed circuit board 100 and includes contacts (not shown) that interface with land pads 125–127 on the printed circuit board 100. The electrical connector 110 receives off-board signals that are transmitted to the land pads 125–127. The signals must be routed on signal lines making a 90° turn from the electrical connector 110 to the land pads 125–127.

Signal lines 130, 140, and 150 route signals from the electrical connector 110 to the land pads 125–127. The signal line 130 includes a first section 131 on a first layer 160 of the printed circuit board 100 that connects a first location on the electrical connector 110 to a first via 135 on the first layer 160 of the printed circuit board 100. The signal line 130 includes a second section 132 on a second layer (not shown) of the printed circuit board 100 that connects the first via 135 to the land pad 127. The signal line 140 includes a first section 141 on the first layer 160 of the printed circuit board 100 that connects a second location on the electrical connector 110 to a second via 145 on the first layer 160 of the printed circuit board 100. The signal line 140 includes a second section 142 on the second layer of the printed circuit board 100 that connects the second via 145 to the land pad 126. The signal line 150 includes a first section 151 on the first layer 160 of the printed circuit board 100 that connects a third location on the electrical connector 110 to a third via 155 on the first layer 160 of the printed circuit board 100. The signal line 150 includes a second section 152 on the second layer of the printed circuit board 100 that connects the third via 155 to the land pad 125.

In the past when two layers of a printed circuit board were used for routing 90° signal lines, the signal lines were routed one direction on a first layer and would make a 90° turn at via "T" points on the second layer. The vias were typically packed close together to minimize the amount of space the signal lines would occupy on the printed circuit board. The vias would be placed without taking into consideration their affect on the length of their corresponding signal line. As a result, as illustrated in FIG. 1, the length of the signal lines 130, 140, and 150 would differ in length. The length of a signal line affects the electrical delay and capacitance on the signal line. Differences in electrical delay and capacitance between signal lines may adversely effect the performance of devices connected to the signal lines that operate at high speeds.

SUMMARY

A printed circuit board (PCB) is disclosed. The PCB includes a first 90° signal line. The first 90° signal line connects a first location on a first layer of the PCB to a second location on a second layer of the PCB. The PCB includes a second 90° signal line. The second 90° signal line is adjacent and equal in length to the first 90° signal line. The second 90° signal line connects a third location on the first layer of the PCB to a fourth location on the second layer of the PCB.

BRIEF DESCRIPTION OF THE DRAWINGS

The present invention is illustrated by way of example and not by way of limitation in the figures of the accompanying drawings, in which the like references indicate similar elements in and in which:

FIG. 2 is a block diagram of a computer system implementing an embodiment of the present invention;

FIG. 3 illustrates a memory system mounted on a motherboard according to an embodiment of the present invention;

FIG. 4 illustrates an exemplary memory module according to an embodiment of the present invention;

FIG. 5 illustrates an exemplary technique for routing signal lines making 90° turns on a printed circuit board utilizing two layers of the printed circuit board according to an embodiment of the present invention;

FIG. 6 illustrates an exemplary technique for routing signal lines making 90° turns on a printed circuit board utilizing four layers of the printed circuit board according to an embodiment of the present invention;

FIG. 7 illustrates an exemplary technique for routing signal lines making 180° turns on a printed circuit board utilizing four layers of the printed circuit board according to an embodiment of the present invention; and FIG. 8 is a flow chart illustrating a method for routing signals according to an embodiment of the present invention.

DETAILED DESCRIPTION

Figure 1:
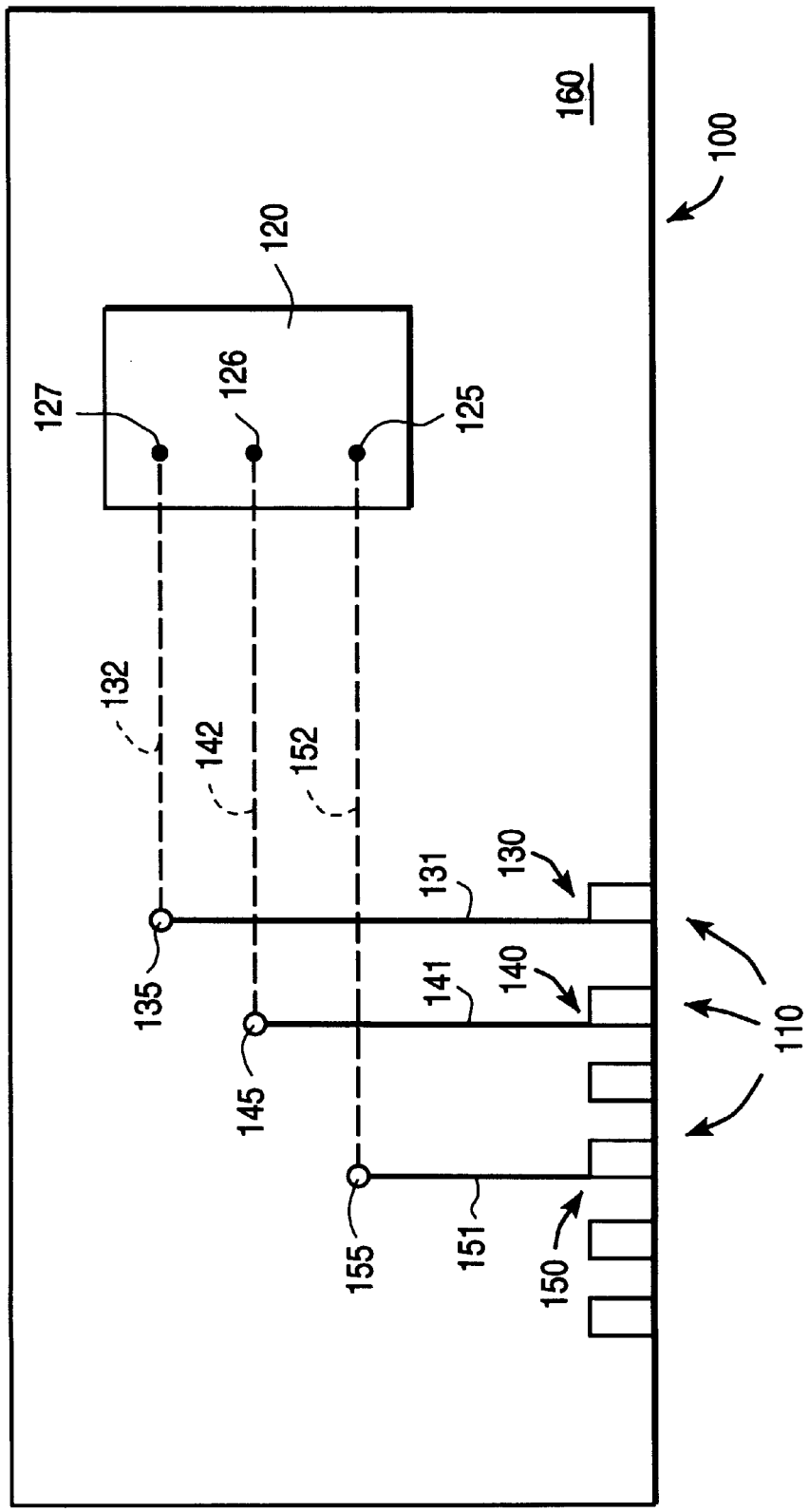
FIG. 1 illustrates a prior art routing techniques for routing signal lines making 90° turns on a printed circuit board.

FIG. 2 illustrates a computer system upon which an embodiment of the present invention can be implemented is shown as 200. The computer system 200 includes a processor 201 that processes data signals. The processor 201 may be a complex instruction set computer (CISC) microprocessor, a reduced instruction set computing (RISC) microprocessor, a very long instruction word (VLIW) microprocessor, a processor implementing a combination of instruction sets, or other processor device. FIG. 2 shows an example of the present invention implemented on a single processor computer system 200. However, it is understood that the present invention may be implemented in a computer system having multiple processors. The processor 201 is coupled to a CPU bus 210 that transmits data signals between processor 201 and other components in the computer system 200.

The computer system 200 includes a memory 213. The memory 213 may be a dynamic random access memory (DRAM) device, a synchronous dynamic random access memory (SDRAM) device, or other memory device. The memory 213 may store instructions and code represented by data signals that may be executed by the processor 201. According to an embodiment of the computer system 200, the memory 213 comprises a memory system having a plurality of memory modules. Each of the memory modules comprises a printed circuit board having a plurality of memory devices mounted on the printed circuit board. The printed circuit board operates as a daughter card insertable into a socket connector that is connected to the computer system 200.

A bridge memory controller 211 is coupled to the CPU bus 210 and the memory 213. The bridge memory controller 211 directs data signals between the processor 201, the memory 213, and other components in the computer system 200 and bridges the data signals between the CPU bus 210, the memory 213, and a first I/O bus 220.

The first I/O bus 220 may be a single bus or a combination of multiple buses. As an example, the first I/O bus 220 may comprise a Peripheral Component Interconnect (PCI) bus, a Personal Computer Memory Card International Association (PCMCIA) bus, a NuBus, or other buses. The first I/O bus 220 provides communication links between components in the computer system 200. A network controller 221 is coupled to the first I/O bus 220. The network controller 221 links the computer system 200 to a network of computers (not shown in FIG. 2) and supports communication among the machines. A display device controller 222 is coupled to the first I/O bus 220. The display device controller 222 allows coupling of a display device to the computer system 200 and acts as an interface between the display device and the computer system 200. The display device controller may be a monochrome display adapter (MDA) card, a color graphics adapter (CGA) card, an enhanced graphics adapter (EGA) card, an extended graphics array (XGA) card or other display device controller. The display device may be a television set, a computer monitor, a flat panel display or other display device. The display device receives data signals from the processor 201 through the display device controller 222 and displays the information and data signals to the user of the computer system 200. A video camera 223 is coupled to the first I/O bus 220.

A second I/O bus 230 may be a single bus or a combination of multiple buses. As an example, the second I/O bus 230 may comprise a PCI bus, a PCMCIA bus, a NuBus, an Industry Standard Architecture (ISA) bus, or other buses. The second I/O bus 230 provides communication links between components in the computer system 200. A data storage device 231 is coupled to the second I/O bus 230. The data storage device 231 may be a hard disk drive, a floppy disk drive, a CD-ROM device, a flash memory device or other mass storage device. A keyboard interface 232 is coupled to the second I/O bus 230. The keyboard interface 232 may be a keyboard controller or other keyboard interface. The keyboard interface 232 may be a dedicated device or can reside in another device such as a bus controller or other controller. The keyboard interface 232 allows coupling of a keyboard to the computer system 200 and transmits data signals from a keyboard to the computer system 200. An audio controller 233 is coupled to the second I/O bus 230. The audio controller 233 operates to coordinate the recording and playing of sounds is also coupled to the I/O bus 230.

A bus bridge 224 couples the first I/O bus 220 to the second I/O bus 230. The bus bridge 224 operates to buffer and bridge data signals between the first I/O bus 220 and the second I/O bus 230.

FIG. 3 illustrates a memory system 213 according to an embodiment of the present invention. The memory system 213 resides on a motherboard 300 of the computer system 200 (shown in FIG. 2). The motherboard 300 is a printed circuit board that interconnects components of the computer system 200 such as the bridge memory controller 211, the processor 201 and other components. The memory system 213 includes a plurality of memory modules 310–312. Each of the memory modules includes a plurality of memory devices mounted on the memory module. The memory system also includes a plurality of socket connectors 320–322 mounted on the motherboard 300. The memory modules 310–312 are insertable into the socket connectors 320–322. Electrical connectors on the memory module interface with electrical contacts in the socket connector. The electrical connectors and the electrical contacts allow components on the motherboard 300 to access the memory devices on the memory module. It should be appreciated that any number of socket connectors may be mounted on the motherboard to receive any number of memory modules. It should also be appreciated that any number of memory devices may be mounted on each memory module.

FIG. 4 illustrates an exemplary memory module 310 according to an embodiment of the present invention. The memory module 310 includes a plurality of memory devices 420-427 on the memory module 310. The memory device 420 includes a plurality of contacts (not shown) that interface with land pads 480–484 on the memory module 310. Memory devices 421–427 also include a plurality of contacts that interface with land pads on the memory module 310 but are not shown in FIG. 4. According to an embodiment of the present invention, the memory devices 420–427 are SDRAM devices. It should be appreciated that any type of memory devices may be mounted on the memory module 310. The memory devices 420–427 may be packaged in a ball grid array (BGA), chip scale package (CSP), or other type of packaging.

The memory module 310 includes an electrical connector 410 that operates to receive signals from and transmit signals to the bridge memory controller 211 (shown in FIG. 2). According to an embodiment of the present invention, the electrical connector 410 receives address, data, control, and clock signals from the memory controller 211. A plurality of signal lines 430, 440, 450, 460, and 470 are coupled to the electrical connector 410. The signal lines 430, 440, 450, 460, and 470 operate to transmit signals from the electrical connector 410 to land pads 480–484 on the memory device 420. The signal lines 430, 440, 450, 460, and 470 make a 90° turn from the electrical connector 410 to the land pads 480–484. According to an embodiment of the present invention, the signal lines 430, 440, 450, 460, and 470 are routed through two layers of the printed circuit board of the memory module 310. The signal lines 430, 440, 450, 460, and 470 are equal in length in that the signal lines are substantially equal in physical length within a predetermined tolerance under current manufacturing capabilities that yield unmeasurable and/or insignificant differences in electrical characteristics.

FIG. 5 illustrates an exemplary technique for routing signal lines making 90° turns on a printed circuit board utilizing two layers of the printed circuit board according to an embodiment of the present invention. The signal line 430 includes a first trace 531 on a first layer 510 of the memory module 310 that connects a first location 511 on the electrical connector 410 to a first via 535 on the first layer 510 of the memory module 310. The signal line 430 includes a second trace 532 on a second layer (not shown) of the memory module 310 that connects the first via 535 to the land pad 480. The signal line 440 includes a first trace 541 on the first layer 510 of the memory module 310 that connects a second location 512 on the electrical connector 410 to a second via 545 on the first layer 510 of the memory module 310. The signal line 440 includes a second trace 542 on the second layer of the memory module 310 that connects the second via 545 to the land pad 481. The signal line 450 includes a first trace 551 on the first layer 510 of the memory module 310 that connects a third location 513 on the electrical connector 410 to a third via 555 on the first layer 510 of the memory module 310. The signal line 450 includes a second trace 552 on the second layer of the memory module 310 that connects the third via 555 to the land pad 482. The signal line 460 includes a first trace 561 on the first layer 510 of the memory module 310 that connects a fourth location 514 on the electrical connector 410 to a fourth via 565 on the first layer 510 of the memory module 310. The signal line 460 includes a second trace 562 on the second layer of the memory module 310 that connects the fourth via 565 to the land pad 483. The signal line 470 includes a first trace 571 on the first layer 510 of the memory module 310 that connects a fifth location 515 on the electrical connector 410 to a fifth via 575 on the first layer 510 of the memory module 310. The signal line 470 includes a second trace 572 on the second layer of the memory module 310 that connects the fifth via 575 to the land pad 484.

The signal lines 430, 440, 450, 460, and 470 are routed such that they are equal in length. This is achieved by selecting a signal line length and strategically placing the vias 535, 545, 555, 565, and 575 at a location on the memory module 310 such that signal lines routing through the vias 535, 545, 555, 565, and 575 would equal that signal line length. According to an embodiment of the present invention, some of the vias are placed at locations on the memory module 310 which would require a section of a second trace on a second layer to double back towards a direction previously traveled by a section of a first trace on a first layer. Thus, when a signal line connecting a land pad and a location on the electrical connector 410 is shorter in length than the selected signal line length, a via corresponding to the signal line may be strategically moved to lengthen the traces on the signal line so that the length of the signal line matches the selected signal line length.

According to an embodiment of the present invention, when a section of a second trace doubles back towards a direction previously traveled by a section of a first trace, the section of the second trace may or may not directly retrace a path taken by a section of the first trace. Signal line 430 includes a first trace 531 having a first section 533 that is doubled back by a second section 534 of a second trace 532. A portion of the second section 534 retraces a path taken by a portion of the first section 533. Signal line 440 includes a first trace 541 having a first section 543 that is doubled back by a second section 544 of a second trace 542. A portion of the second section 544 also retraces a path taken by a portion of the first section 543. Signal line 450 includes a first trace 551 having a first section 553 that is doubled back by a second section 554 of a second trace 552. The second section 554 does not retrace a path taken by the first section 553. Signal line 460 includes a first trace 561 having a first section 563 that is doubled back by a second section 564 of a second trace 562. The second section 564 does not retrace a path taken by the first section 563.

FIG. 6 illustrates an exemplary technique for routing signal lines making 90° turns on a printed circuit board utilizing four layers of a printed circuit board according to an embodiment of the present invention. FIG. 6 illustrates a memory module 311 having a memory device 620 mounted on. The memory device 620 includes a plurality of contacts (not shown) that interface with land pads 480-484 on the memory module 311 similarly to the memory device 420. The memory device 620 includes an additional plurality of contacts (not shown) that interface with land pads 680–684 on the memory module 311. The memory module 311 includes a plurality of signal lines 430, 440, 450, 460, and 470 that are equal in length and that connect locations on the electrical connector 410 to land pads 480–484 similarly to the memory module 310. The memory module 311 includes an additional plurality of signal lines 630, 640, 650, 660, and 670 that connect additional locations on the electrical connector 410 to the land pads 680–684. The signal lines 630, 640, 650, 660, and 670 are routed on a third layer (not shown) and a fourth layer (not shown) of the memory module 311.

The signal line 630 includes a first trace 631 on a third layer (not shown) of the memory module 311 that connects a sixth location 611 on the electrical connector 410 to a sixth via 635 on the third layer of the memory module 311. The signal line 630 includes a second trace 632 on a fourth layer of the memory module 311 that connects the sixth via 635 to the land pad 680. The signal line 640 includes a first trace 641 on the third layer of the memory module 311 that connects a seventh location 612 on the electrical connector 410 to a seventh via 645 on the third layer of the memory module 311. The signal line 640 includes a second trace 642 on the fourth layer of the memory module 311 that connects the seventh via 645 to the land pad 681. The signal line 650 includes a first trace 651 on the third layer of the memory module 311 that connects a eighth location 613 on the electrical connector 410 to a eighth via 655 on the third layer of the memory module 311. The signal line 650 includes a second trace 652 on the fourth layer of the memory module 311 that connects the eighth via 655 to the land pad 682. The signal line 660 includes a first trace 661 on the third layer of the memory module 311 that connects a ninth location 614 on the electrical connector 410 to a ninth via 665 on the third layer of the memory module 311. The signal line 660 includes a second trace 662 on the fourth layer of the memory module 311 that connects the ninth via 665 to the land pad 683. The signal line 670 includes a first trace 671 on the third layer of the memory module 311 that connects a tenth location 615 on the electrical connector 410 to a tenth via 675 on the third layer of the memory module 311. The signal line 670 includes a second trace 672 on the fourth layer of the memory module 311 that connects the tenth via 675 to the land pad 684.

As illustrated in FIG. 6, the signal lines 630, 640, 650, 660, and 670 are routed similarly to signal lines 430, 440, 450, 460, and 470 in that they are routed such that they are equal in length. This is achieved by selecting a signal line length and strategically placing the vias 635, 645, 655, 665, and 675 at locations on the memory module 311 such that signal lines routing through the vias 635, 645, 655, 665, and 675 would equal that signal line length. According to an embodiment of the present invention, some of the vias are placed at a location on the memory module 311 which would require a section of a second trace on one layer to double back towards a direction previously traveled by a section of a first trace on a second layer. By utilizing a third and fourth layer of the memory module 311, a portion of the signal lines 630, 640, 650, 660, and 670 may be routed above or underneath signal lines 430, 440, 450, 460, and 470 thus conserving surface area on the memory module 311. Utilizing an additional two layers of the memory module 311 to route 90° signal lines allows twice as many signal lines to be routed in the same amount of space.

FIG. 7 illustrates an exemplary technique for routing signal lines making 180° turns on a printed circuit board utilizing four layers of the printed circuit board according to an embodiment of the present invention. FIG. 7 illustrates the memory module 312 having a first memory device 710 and a second memory device 720. The first memory device 710 includes a plurality of contacts (not shown) that interface with land pads 711–716 on the memory module 312. The second memory device 720 includes a plurality of contacts (not shown) that interface with land pads 721–726 on the memory module 312. The memory module 312 includes a plurality of signal lines 730, 740, 750, 760, 770, and 780 that connect the land pads 711–716 interfacing the first memory device 710 with the land pads 721–726 interfacing the second memory device 720. The memory devices 710 and 720 are configured on the memory module 312 such that the signal lines 730, 740, 750, 760, 770, and 780 must be routed to make a 180° turn in order to connect the land pads 711–716 to the land pads 721–726.

The signal line 730 includes a first trace 731 on a first layer 700 of the memory module 312 that connects the land pad 711 to a first via 732 on the first layer 700 of the memory module 312. The signal line 730 includes a second trace 733 on a second layer (not shown) of the memory module 312 that connects the first via 732 to a second via 734 on the second layer of the memory module 312. The signal line 730 includes a third trace 735 on the first layer 700 of the memory module 310 that connects the second via 734 to the land pad 721 on the first layer 700 of the memory module 312.

The signal line 740 includes a first trace 741 on a third layer (not shown) of the memory module 312 that connects the land pad 712 to a third via 742 on the third layer of the memory module 312. The signal line 740 includes a second trace 743 on a fourth layer (not shown) of the memory module 312 that connects the third via 742 to a fourth via 744 on the fourth layer of the memory module 312. The signal line 740 includes a third trace 745 on the third layer of the memory module 312 that connects the fourth via 744 to the land pad 722 on the third layer of the memory module 312. By routing the signal line 740 through the third and fourth layers of the memory module 312, portions of the signal line 740 may be routed above or beneath the signal line 750 as illustrated in FIG. 7. This allows surface area on the memory module 312 to be conserved while increasing signal line routing density.

The signal line 750 includes a first trace 751 on a first layer 700 of the memory module 312 that connects the land pad 713 to a fifth via 752 on the first layer 700 of the memory module 312. The signal line 750 includes a second trace 753 on a second layer (not shown) of the memory module 312 that connects the fifth via 752 to a sixth via 754 on the second layer of the memory module 312. The signal line 750 includes a third trace 755 on the first layer 700 of the memory module 312 that connects the sixth via 754 to the land pad 723 on the first layer 700 of the memory module 312.

The signal line 760 includes a first trace 761 on a third layer of the memory module 312 that connects the land pad 714 to a seventh via 762 on the third layer of the memory module 312. The signal line 760 includes a second trace 763 on the fourth layer of the memory module 312 that connects the seventh via 762 to a eighth via 764 on the fourth layer of the memory module 312. The signal line 760 includes a third trace 765 on the third layer of the memory module 312 that connects the eighth via 764 to the land pad 724 on the third layer of the memory module 312. By routing the signal line 760 through the third and fourth layers of the memory module 312, portions of the signal line 760 may be routed above or beneath the signal line 770 as illustrated in FIG. 7. This allows surface area on the memory module 312 to be conserved while increasing signal line routing density.

The signal line 770 includes a first trace 771 on a first layer 700 of the memory module 312 that connects the land pad 715 to a ninth via 772 on the first layer 700 of the memory module 312. The signal line 770 includes a second trace 773 on a second layer of the memory module 312 that connects the ninth via 772 to a tenth via 774 on the second layer of the memory module 312. The signal line 770 includes a third trace 775 on the first layer 700 of the memory module 312 that connects the tenth via 774 to the land pad 725 on the first layer 700 of the memory module 312.

The signal line 780 includes a first trace 781 on a third layer of the memory module 312 that connects the land pad 716 to an eleventh via 782 on the third layer of the memory module 312. The signal line 780 includes a second trace 783 on a fourth layer of the memory module 312 that connects the eleventh via 782 to a twelfth via 784 on the fourth layer of the memory module 312. The signal line 780 includes a third trace 785 on the third layer of the memory module 312 that connects the twelfth via 784 to the land pad 726 on the third layer of the memory module 312.

The signal lines 730, 740, 750, 760, 770, and 780 are routed such that they are equal in length. This is achieved by selecting a signal line length and strategically placing the vias 732, 734, 742, 744, 752, 754, 762, 764, 772, 774, 782, and 784 at locations on the memory module 312 such that signal lines routing through them would equal that signal line length. According to an embodiment of the present invention, some of the vias are placed at a location on the memory module 312 which would require a section of a second trace on a first layer to double back towards a direction previously traveled by a section of a first trace on a second layer. According to an embodiment of the present invention, some of the vias are placed at a location on the memory module 312 which would require a section of a fourth trace on one layer to double back towards a direction previously traveled by a section of a third trace on a second layer. Thus, when a signal line connecting a first land pad and a second land pad is shorter in length than the selected signal line length, vias corresponding to the signal line may be strategically moved to lengthen the traces on the signal line so that the length of the signal line matches the selected signal line length. It should be appreciated that two layers and one row of vias may also be used to make a 180° turn.

The routing techniques of the present invention is disclosed as being implemented on the memory system 213 (shown in FIG. 3). It should be appreciated that the routing techniques of the present invention may be implemented on any type of application requiring signal lines to make 90° or 180° turns. The signal lines may be used to connect contacts, land pads, electrical connectors or any other electrical connection on any layer of a printed circuit board.

FIG. 8 is a flow chart illustrating a method for routing signals according to an embodiment of the present invention. At step 801, a signal line length is determined. According to an embodiment of the present invention, the signal line length may be determined by estimating a maximum distance between two locations that require a signal line connection.

At step 802, a first signal line is routed 90°'s from a first location on a printed circuit board to a second location on the printed circuit board. According to an embodiment of the present invention, the first location is on a first layer of the printed circuit board and the second location is on a second layer of the printed circuit board. The first signal line is routed from the first location to a first via on the first layer of the printed circuit board. The first signal line is routed from the first via to the second location on the second layer of the printed circuit board.

At step 803, a second signal line is routed 90°'s from a third location on the printed circuit board to a fourth location on the printed circuit board while matching the length of the second signal line with the first signal line. According to an embodiment of the present invention, the third location is on the first layer of the printed circuit board and fourth location is on a second layer of the printed circuit board. The second signal line is routed from the third location to a second via on the first layer of the printed circuit board. The second signal line is routed from the second via to the fourth location on the second layer of the printed circuit board. According to an alternate embodiment of the present invention, the third location is on a third layer of the printed circuit board and the fourth location is on a fourth layer of the printed circuit board. The second signal line is routed from the third location to a second via on the third layer of the printed circuit board. The second signal line is routed from the second via to the fourth location on the fourth layer of the printed circuit board.

The length of the second signal line is matched with the first signal line by selecting a placement of the first and second vias such that a sum of the length of a first trace connecting the first location and the first via and the length of a second trace connecting the first via and the second location match that of a sum of the length of a third trace connecting the third location and the second via and the length of a fourth trace connecting the second via to the fourth location. According to an embodiment of the present invention, the placement of the first and second vias causes a section of the second and fourth traces to double back in a direction traveled by a section of the first and third traces.

In the foregoing description, the invention is described with reference to specific exemplary embodiments thereof. It will, however, be evident that various modifications and changes may be made thereto without departing from the broader spirit and scope of the present invention as set forth in the appended claims. The specification and drawings are, accordingly to be regarded in an illustrative rather than a restrictive sense.

What is claimed is:

1. A method for routing signals on a printed circuit board (PCB), comprising:
   routing a first signal line 90°'s from a first location on a first layer of the PCB to a second location on a second layer of the PCB;
   routing a second signal line, adjacent to the first signal line, 90°'s from a third location on the first layer of the PCB to a fourth location on the second layer of the PCB while matching the length of the second signal line with the first signal line.

2. The method of claim 1, wherein routing the first signal line, comprises:
   routing the first signal line from the first location to a first via on the first layer of the PCB; and
   routing the first signal line from the first via to the second location on the second layer of the PCB.

3. The method of claim 1, wherein routing the second signal line, comprises:
   routing the second signal line from the third location to a second via on the first layer of the PCB; and
   routing the second signal line from the second via to the fourth location on the second layer of the PCB.

4. The method of claim 3, wherein matching the length of the second signal line with the first signal line comprises:

determining a signal line length; and
   selecting a placement of the first and second vias such that a sum of a length of a first trace connecting the first location and the first via and a length of a second trace connecting the first via and the second location match that of a sum of a length of a third trace connecting the third location and the second via and a length of a fourth trace connecting the second via and the fourth location.

5. The method of claim 4, wherein the placement of the second via causes a section of the fourth trace to double back in a direction traveled by a section of the third trace.

6. A method for routing signals on a printed circuit board (PCB), comprising:
   routing a first signal line 90°'s from a first location on a first layer of the PCB to a second location on a second layer of the PCB; and
   routing a second signal line 90°'s from the third location on a third layer of the PCB to fourth location on a fourth layer of the PCB while matching the length of the second signal line with the first signal line.

7. The method of claim 6, wherein routing the first signal line comprises:
   routing the first signal line from the first location on the PCB to a first via on a first layer of the PCB; and
   routing the first signal line from the first via to a second location on a second layer of the PCB.

8. The method of claim 6, wherein routing the second signal line comprises:
   routing the second signal line from a third location on the PCB to a second via on a third layer of the PCB; and
   routing the second signal from the via to the fourth location on the fourth layer of the PCB.

9. The method of claim 8, wherein matching the length of the first signal line with the second signal line comprises:
   determining a signal line length; and
   selecting a placement of the first and second vias such that a sum of a length of a first trace connecting the first location and the first via and a length of a second trace connecting the first via and the second location match that of a sum of a length of a third trace connecting the third location and the second via and a length of a fourth trace connecting the second via and the fourth location.

10. The method of claim 9, wherein the placement of the second via causes a section of the fourth trace to double back in a direction traveled by a section of the third trace.

11. A printed circuit board (PCB), comprising:
    a first 90° signal line that connects a first location on a first layer of the PCB to a second location on a second layer of the PCB; and
    a second 90° signal line, adjacent and equal in length to the first 90° signal line, that connects a third location on the first layer of the PCB to a fourth location on the second layer of the PCB.

12. The PCB board of claim 11, wherein the first 90° signal line, comprises:
    a first trace that connects the first location to a first via on the first layer of the PCB; and
    a second trace that connects the first via to the second location on the second layer of the PCB.

13. The PCB board of claim 11, wherein the second 90° signal line comprises:
    a third signal trace that connects the third location to a second via on the first layer of the PCB; and a fourth trace that connects the second via to the fourth location on the second layer of the PC.

14. A printed circuit board (PCB), comprising:
a first 90° signal line that connects a first location on a first layer of the PCB to a second location on a second layer of the PCB;
a second 90° signal line, adjacent and equal in length to the first 90° signal line, that connects a third location on a third layer of the PCB to a fourth location on a fourth layer of the PCB.

15. The PCB of claim 14, wherein the first 90° signal line, comprises:
a first trace that connects the first location to a first via on the first layer of the PCB; and
a second trace that connects the first via to the second location on the second layer of the PCB.

16. The PC board of claim 14, wherein the second 90° signal line comprises:
a third trace that connects the third location to a second via on the third layer of the PCB; and
a fourth trace that connects the second via to a fourth location on the fourth layer of the PCB.

17. A printed circuit board (PCB), comprising:
a first 180° signal line that connects a first location on a first layer of the PCB to a second location on the first layer of the PCB;
a second 180° signal line, adjacent and equal in length to the first 180° signal line, that connects a third location on a third layer of the PCB to a fourth location on a third layer of the PCB.

18. The PCB of claim 17, wherein the first 180° signal line, comprises:
a first trace on the first layer of the PCB that connects the first location to a first via on the first layer of the PCB;
a second trace on the second layer of the PCB that connects the first via to a second via on the second layer of the PCB; and
a third trace on the first layer of the PCB that connects the second via to the second location on the first layer of the PCB.

19. The PCB of claim 17, wherein the second 180° signal line comprises:
a fourth trace on the third layer of the PCB that connects the third location to a third via on the third layer of the PC board;
a fifth trace on the fourth layer of the PCB that connects the third via to a fourth via on the fourth layer of the PCB; and
a sixth trace on the third layer of the PCB that connects the fourth via to a fourth location on the third layer of the PCB.

20. A computer system, comprising:
a bus;
a processor coupled to the bus; and
a memory system, coupled to the bus, that includes a memory module having a first 90° signal line that connects a first location on a first layer of the memory module to a second location on a second layer of the memory module, and a second 90° signal line, adjacent and equal in length to the first 90° signal line, that connects a third location on the first layer of the memory module to a fourth location on the second layer of the memory module.

21. The computer system of claim 20, wherein the first 90° signal line, comprises:
a first trace that connects the first location to a first via on the first layer of the memory module; and
a second trace that connects the first via to the second location on the second layer of the memory module.

22. The computer system of claim 20, wherein the second 90° signal line comprises:
a third trace that connects the third location to a second via on the first layer of the memory module; and
a fourth trace that connects the second via to a fourth location on the second layer of the memory module.

* * * * *